United States Patent
Eitel et al.

(10) Patent No.: US 11,473,911 B2
(45) Date of Patent: Oct. 18, 2022

(54) HEADING DETERMINATION DEVICE AND METHOD, RENDERING DEVICE AND METHOD

(71) Applicant: Sony Semiconductor Solutions Corporation, Kanagawa (JP)

(72) Inventors: Ben Eitel, Stuttgart (DE); Daniel Schneider, Stuttgart (DE); Mark Veltman, Stuttgart (DE)

(73) Assignee: SONY SEMICONDUCTOR SOLUTIONS CORPORATION, Tokyo (JP)

(*) Notice: Subject to any disclaimer, the term of this patent is extended or adjusted under 35 U.S.C. 154(b) by 86 days.

(21) Appl. No.: 16/758,862

(22) PCT Filed: Oct. 26, 2018

(86) PCT No.: PCT/EP2018/079478
§ 371 (c)(1),
(2) Date: Apr. 24, 2020

(87) PCT Pub. No.: WO2019/081747
PCT Pub. Date: May 2, 2019

(65) Prior Publication Data
US 2020/0370889 A1    Nov. 26, 2020

(30) Foreign Application Priority Data
Oct. 26, 2017  (EP) .................................... 17198673

(51) Int. Cl.
G01C 21/08    (2006.01)
G01C 21/16    (2006.01)
(Continued)

(52) U.S. Cl.
CPC .......... *G01C 21/08* (2013.01); *G01C 21/165* (2013.01); *G01C 21/20* (2013.01); *G01R 33/0206* (2013.01)

(58) Field of Classification Search
CPC ...... G01C 21/08; G01C 21/165; G01C 21/20; G01C 21/206; G01C 21/16; G01C 17/38; G01R 33/0206
(Continued)

(56) References Cited

U.S. PATENT DOCUMENTS 5,779,640 A * 7/1998 Holley ................ G01S 7/52046
                                                    600/447
6,549,004 B1    4/2003 Prigge
(Continued)

FOREIGN PATENT DOCUMENTS

EP    3034996 A1    6/2016
EP    3067781 A1    9/2016
(Continued)

OTHER PUBLICATIONS

International Search Report and Written Opinion dated Apr. 18, 2019 for PCT/EP2018/079478 filed on Oct. 26, 2018, 25 pages.
(Continued)

*Primary Examiner* — Jeffrey P Aiello
(74) *Attorney, Agent, or Firm* — Xsensus, LLP

(57) ABSTRACT

A heading determination device comprises data input circuitry configured to obtain magnetic field sensor data sensed by a magnetic field sensor in sensor coordinates, position input circuitry configured to obtain a position estimate of the magnetic field sensor, and estimation circuitry configured to derive, from a magnetic map, a local azimuth distortion value in a reference coordinate system at the current position of the magnetic field sensor indicated by the obtained position estimate and to estimate the heading of the mag-
(Continued)

| Abbreviation | Name |
|---|---|
| x | x component |
| y | y component |
| z | z component |
| m | magnitude |
| i | inclination |
| a | azimuth |
| h | horizontal |
| v | vertical |

Equivalent representations:

$hv \overset{eq.}{\Leftrightarrow} mi$ $xyz \overset{eq.}{\Leftrightarrow} mia$ netic field sensor in the reference coordinate system based on the obtained magnetic field sensor data and the derived local azimuth distortion value.

16 Claims, 7 Drawing Sheets

(51) Int. Cl.
*G01C 21/20* (2006.01)
*G01R 33/02* (2006.01)

(58) Field of Classification Search
USPC ..... 324/244, 329; 701/408; 702/92–94, 104, 702/150–153; 33/356
See application file for complete search history.

(56) References Cited

U.S. PATENT DOCUMENTS

| | | | | |
|---|---|---|---|---|
| 8,275,544 | B1* | 9/2012 | Wells | G01S 17/86 |
| | | | | 701/501 |
| 10,082,522 | B2* | 9/2018 | Dobra | G01C 25/005 |
| 2007/0117078 | A1* | 5/2007 | Bruns | G09B 27/00 |
| | | | | 434/284 |
| 2012/0143495 | A1 | 6/2012 | Dantu | |
| 2012/0203487 | A1* | 8/2012 | Johnson | G01C 25/005 |
| | | | | 702/104 |
| 2013/0151139 | A1 | 6/2013 | Park | |
| 2014/0180627 | A1* | 6/2014 | Naguib | G01C 21/08 |
| | | | | 702/150 |
| 2014/0340427 | A1* | 11/2014 | Baker | H04N 13/207 |
| | | | | 345/641 |
| 2015/0260524 | A1 | 9/2015 | Haverinen | |
| 2015/0378045 | A1 | 12/2015 | Kim et al. | |
| 2017/0062900 | A1* | 3/2017 | Velez | H01Q 1/125 |
| 2018/0188032 | A1* | 7/2018 | Ramanandan | G01C 21/165 |

FOREIGN PATENT DOCUMENTS

| | | |
|---|---|---|
| JP | 2018-026048 A2 | 2/2018 |
| WO | 2009/128859 A1 | 10/2009 |
| WO | 2013/114831 A1 | 8/2013 |
| WO | WO 2013114831 A1 * | 8/2013 |
| WO | 2016/006967 A1 | 1/2016 |

OTHER PUBLICATIONS

Li, B., et al., "Using Geomagnetic Field for Indoor Positioning," International Global Navigation Satellite Systems Society (IGNSS Symposium), Outrigger Gold Coast, Qld Australia, Jul. 16-18, 2013, 12 pages.

* cited by examiner

| Abbreviation | Name |
|---|---|
| x | x component |
| y | y component |
| z | z component |
| m | magnitude |
| i | inclination |
| a | azimuth |
| h | horizontal |
| v | vertical |

Equivalent representations:

$$hv \overset{eq.}{\Leftrightarrow} mi$$

$$xyz \overset{eq.}{\Leftrightarrow} mia$$

HEADING DETERMINATION DEVICE AND METHOD, RENDERING DEVICE AND METHOD

BACKGROUND

Cross-Reference to Related Applications

The present application is based on PCT filing PCT/EP2018/079478, filed Oct. 26, 2018, and claims priority to EP 17198673.0, filed Oct. 26, 2017, the entire contents of each are incorporated herein by reference.

Field of the Disclosure

The present disclosure relates to a heading determination device and method for determining the heading of a magnetic field sensor. Further, the present disclosure relates to a rendering device and method for rendering target information. Still further, the present disclosure relates to a rendering system.

Description of Related Art

The use of today's widespread technologies for outdoor navigation may be problematic for indoor positioning and navigation mainly because of two reasons: GNSS (global navigation satellite system) signals are not available indoors and ferrous materials in the building construction heavily distort the geomagnetic field used for outdoor compass-based navigation. Further, in various applications, the heading (and optionally orientation, i.e. heading and inclination (attitude)) with respect to a reference coordinate system is of interest.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a heading determination device and method, a rendering device and method, and a rendering system which allow/improve determining and using the heading of the respective device. It is a further object to provide a corresponding computer program and a non-transitory computer-readable recording medium for implementing said methods.

According to an aspect there is provided a heading determination device comprising:
data input circuitry configured to obtain magnetic field sensor data sensed by a magnetic field sensor in sensor coordinates,
position input circuitry configured to obtain a position estimate of the magnetic field sensor, and
estimation circuitry configured to derive, from a magnetic map, a local azimuth distortion value in a reference coordinate system at the current position of the magnetic field sensor indicated by the obtained position estimate and to estimate the heading of the magnetic field sensor in the reference coordinate system based on the obtained magnetic field sensor data and the derived local azimuth distortion value.

According to a further aspect there is provided a rendering device comprising
orientation input circuitry configured to obtain orientation information indicating the orientation of the rendering device,
position input circuitry configured to obtain a position estimate of the rendering device,
target position input circuitry configured to obtain target position information indicating a target position of one or more targets,
relative target position determination circuitry configured to determine the relative position of the one or more targets with respect to the rendering device based on the obtained orientation information, the obtained position estimate and the obtained target position information, and
rendering circuitry configured to render target information related to the one or more targets using the determined relative position of the one or more targets.

According to a further aspect there is provided a rendering system comprising
a magnetic field sensor configured to sense magnetic field sensor data,
a heading determination device as disclosed herein and
a rendering device as disclosed herein configured to determine the relative position of one or more targets with respect to the rendering device based on determined heading or orientation information and to render target information related to one or more targets using the determined relative position of the one or more targets.

According to still further aspects corresponding method, a computer program comprising program means for causing a computer to carry out the steps of the methods disclosed herein, when said computer program is carried out on a computer, as well as a non-transitory computer-readable recording medium that stores therein a computer program product, which, when executed by a processor, causes the methods disclosed herein to be performed are provided.

Embodiments are defined in the dependent claims. It shall be understood that the disclosed methods, the disclosed computer program and the disclosed computer-readable recording medium have similar and/or identical further embodiments as the claimed devices and as defined in the dependent claims and/or disclosed herein.

One of the aspects of the disclosure is to estimate, for devices located in a building, the relative distance and/or direction to a given target (or multiple targets) based on a pre-recorded map of the (distorted) magnetic field of the building. This technology is especially suited for mobile and wearable battery-driven devices as the involved sensors and computations can be realized with very low power consumption. The distance and direction estimate can be used for a wide range of applications ranging from "enhanced" compass-like navigation (direction+distance to target) to realizing virtual sound sources (targets) in a 2D/3D area independent of the user or device position and orientation (sound sources appear in static locations independent of head orientation and user position: augmented reality (AR) sound).

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Before details of the present disclosure will be described, some definitions shall be given. The term "magnetic map" refers to either the magnetic map (comprising magnetic fingerprints) of a whole area, preferably indoors such as a building, or a sub-part of the magnetic map of the whole area, e.g. a sub-part of the building, such as a floor or a wing of the building. A magnetic map for use in the embodiments disclosed herein, or a suitable sub-part of the magnetic map, respectively, comprises magnetic fingerprints of a region around the magnetic field sensor. It can be selected based on a current position of the magnetic field sensor, for example a given position estimate and, optionally, its assumed confidence (e.g. estimated position accuracy), or by a user downloading a suitable magnetic map from a server, etc.

Figure 1:
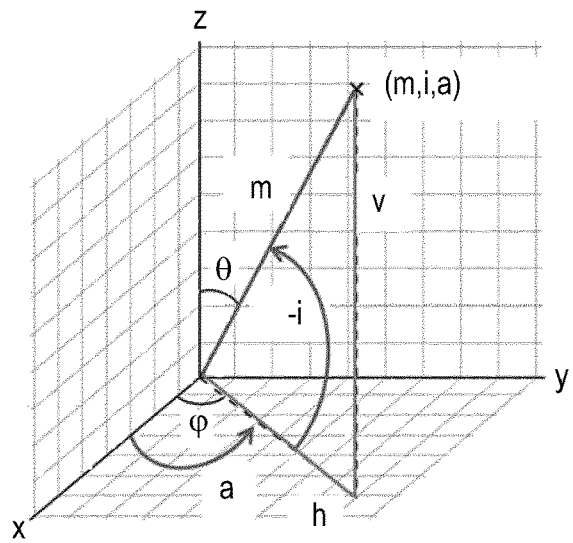
FIG. 1 shows a diagram illustrating coordinate definitions of a magnetic field vector.

Magnetic field sensor data may, for example, be magnetic flow densities in x, y, and z directions of the magnetic field sensor's local coordinate system (i.e. in sensor coordinates) for a 3D sensor. An illustration of different representations of the magnetic field vector is shown in FIG. 1 illustrating coordinate definitions of a magnetic field vector. Example features of the magnetic field vector are magnetic field magnitude m, magnetic field inclination i, magnetic field azimuth a, magnetic field vertical component v, magnetic field horizontal component h, magnetic field Cartesian components (x, y, z) and their combinations. For example, the magnetic field vector may be represented by the feature magnetic field horizontal component h and magnetic field vertical component v. Alternatively, a representation by the feature magnetic field magnitude m and magnetic field inclination i can be used. For some situations, a further alternative representation by the magnetic field magnitude m, the magnetic field inclination i and the magnetic field azimuth a or a representation by the Cartesian components x, y and z may be chosen.

The magnitude of the geomagnetic field (sometimes also referred to as magnetic field vector) is simple to derive from a magnetic field measurement, e.g. by a magnetic field sensor, which process does generally not include any additional estimation process. Therefore, it is the most reliable information for geomagnetic fingerprinting. Unfortunately, similar magnitude values can often be found at different locations of the building, i.e. a geomagnetic field measurement can be assigned to several locations in the building with similar likelihood if only magnitude is considered and a corresponding one-dimensional feature vector is used.

The inclination of the geomagnetic field can be computed based on the magnetic field measurement and the direction of the earth's gravity field, which may be measured by an accelerometer. Aside from gravity, the accelerometer can also measure all other accelerations of the mobile/wearable device. Separation of the different acceleration sources is difficult and introduces errors to the estimation of the gravity direction. This in turn degrades the estimation accuracy of the geomagnetic field inclination. Nonetheless, this information can be used together with the magnitude of the geomagnetic field to obtain a two-dimensional feature vector for geomagnetic fingerprinting. Using the two-dimensional feature vector (fingerprint) reduces the amount of position ambiguities, as magnitude and inclination of the magnetic field are widely uncorrelated.

The azimuth information is more difficult to obtain as input for geomagnetic fingerprinting. In addition to the gravity direction an estimate of the mobile/wearable device heading may be needed, which is prone to estimation errors, especially due to the inherent drift of gyroscope sensor signal information. Consequently, the use of azimuth information for geomagnetic fingerprinting is typically limited to specific applications, e.g. for localization of robots. The sensors are typically fixed to the body of the robot which simplifies the estimation process and hence reduces the amount of estimation errors. Often, the z-coordinate is already aligned to the gravity direction, sensor heading and motion heading have a fixed relation, so that there is no need for step and step length estimation, etc.

Figure 2:
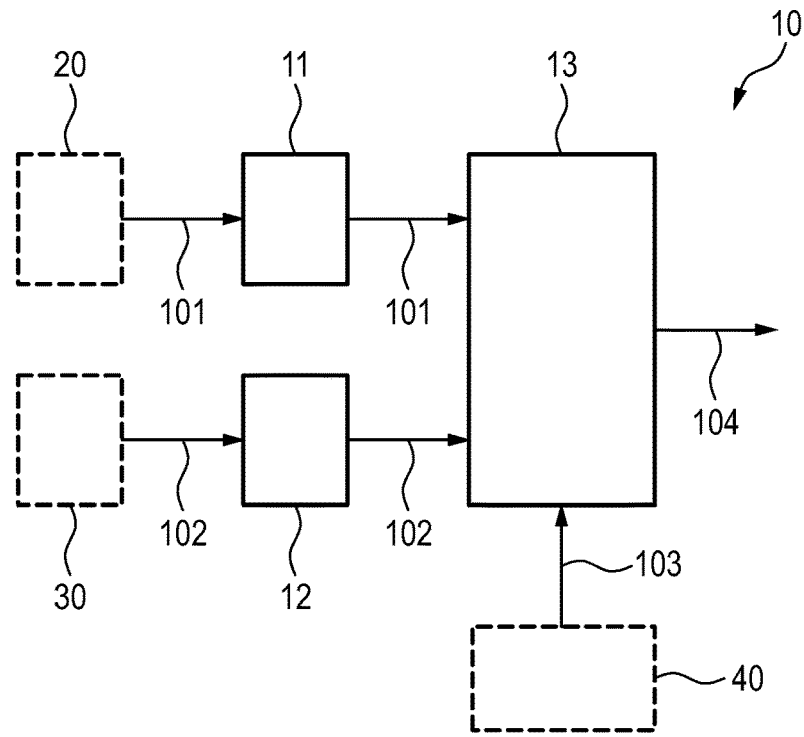
FIG. 2 shows a schematic diagram of a first embodiment of a heading determination device according to the present disclosure.

FIG. 2 shows a schematic diagram of a first embodiment of a heading determination device 10 according to the present disclosure.

The heading determination device 10 comprises data input circuitry 11 configured to obtain magnetic field sensor data 101 sensed by a magnetic field sensor 20 (in this embodiment not being part of the device 10) in sensor coordinates. The data input circuitry 11 may be represented by a data interface, e.g. an interface (such as a HDMI, USB, network interface, etc.) for data reception or retrieval, to receive or retrieve the magnetic field sensor data 101 directly from the magnetic field sensor 20 or from a storage means (e.g. a data carrier, an electronic memory, a buffer, etc.; not shown) where the magnetic field sensor data 101 are stored or buffered.

The heading determination device 10 further comprises a position input circuitry 12 configured to obtain a position estimate 102 of the magnetic field sensor 20. The position input circuitry 12 may also be represented by a separate data interface, e.g. an interface (such as a HDMI, USB, network interface, etc.) for data reception or retrieval, to receive or retrieve the position estimate 102 e.g. from an internal or external position estimation circuitry 30, or may be combined with the data input circuitry 11 into a common interface.

The heading determination device 10 further comprises an estimation circuitry 13 configured to derive, from a magnetic map 103, a local azimuth distortion value in a reference coordinate system at the current position of the magnetic field sensor 20 indicated by the obtained position estimate 102 and to estimate the heading of the magnetic field sensor 20 in the reference coordinate system based on the obtained magnetic field sensor data 101 and the derived local azimuth distortion value. The magnetic map 103 is generally acquired in advance and e.g. provided by a service provider, the owner or operator of a building in which the position determination shall be used, etc., and may be stored in a storage means (not shown; in this embodiment not being part of the device 10) or provided by a server 40 (generally not being part of the device 10), e.g. via the internet or another network. For example, a user may download a magnetic map of a location he wants to visit, or a suitable magnetic map may be downloaded or provided automatically based on current position information of (a device comprising or connected to) the magnetic field sensor 20 (like GPS information obtained before entering a building, or upon detection of a Bluetooth beacon placed at an entry of a building etc.). The estimation circuitry 13 may e.g. be implemented in hard- and/or software, e.g. an appropriately programmed processor or computer.

Thus, according to the present disclosure it is possible to determine at least the heading (i.e. azimuth) of the magnetic field sensor 20 in the reference coordinate system, i.e. in 2D coordinates, without much hard- and software efforts. The third coordinate (i.e. the z-coordinate) may be known in this case. Optionally, in addition the orientation (i.e. inclination and azimuth) of the magnetic field sensor 20 can be determined in the reference coordinate system in 3D coordinates.

Figure 3:
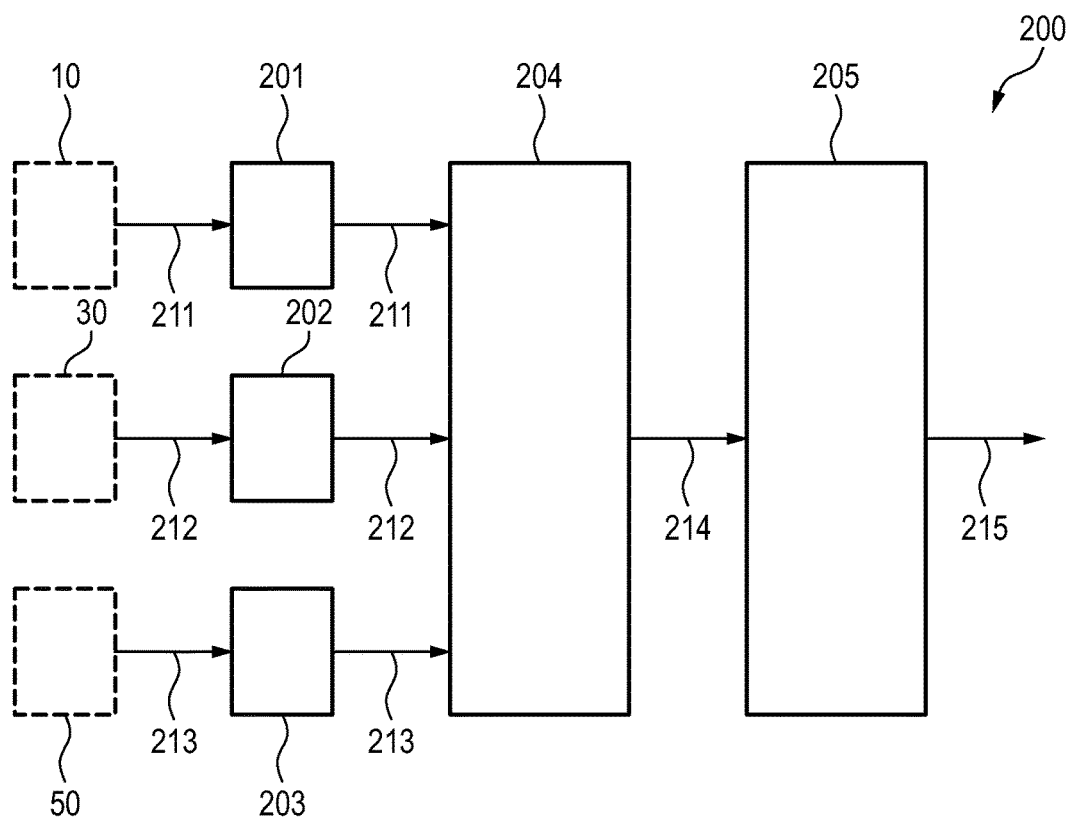
FIG. 3 shows a schematic diagram of a first embodiment of a rendering device according to the present disclosure.

FIG. 3 shows a schematic diagram of a first embodiment of a rendering device 200 according to the present disclosure. The rendering device 200 may e.g. be a handheld device, a wearable device, a mobile phone, a smartphone, a portable phone, a camera, a smart watch, a vital signs monitor, a laptop, a tablet, smart glasses, headphones, earphones or any other portable device that may be carried around by a user.

The rendering device 200 comprises an orientation input circuitry 201 configured to obtain orientation information 211 indicating the orientation of the rendering device 200. The orientation information 211 may e.g. be obtained from an orientation determination device 10 (generally not being part of the rendering device 200) as disclosed herein. The rendering device 200 further comprises a position input circuitry 202 configured to obtain a position estimate 212 of the rendering device 200, e.g. for retrieval or reception of the position estimate from an internal or external position estimation circuitry 30. The rendering device 200 further comprises a target position input circuitry 203 configured to obtain target position information 213 indicating a target position of one or more targets, e.g. from a target information storage or server 50 (generally not being part of the rendering device 200). The target may e.g. be virtual sound source, a virtual light source or any physical target, such as a certain location (e.g. a place that a user wants to reach like a certain department in a shopping mall or office building, a meeting area in a large building, a certain place of production in a large factory, etc.). The orientation input circuitry 201, the position input circuitry 202 and the target position input circuitry 203 may be represented by separate data interfaces or a common interface, e.g. an interface (such as a HDMI, USB, network interface, etc.) for data reception or retrieval.

The rendering device 200 further comprises a relative target position determination circuitry 204 configured to determine the relative position 214 of the one or more targets with respect to the rendering device 200 based on the obtained orientation information 211, the obtained position estimate 212 and the obtained target position information 213. Finally, the rendering device 200 further comprises rendering circuitry 205 configured to render target information 215 related to the one or more targets using the determined relative position 214 of the one or more targets.

With the disclosed rendering device the heading and/or orientation, preferably including a distance and direction estimate, can be used for different applications, such as enhanced compass-like navigation to a target or realization of virtual sound sources (targets) in a 2D/3D area independent of the user or device position and orientation, i.e. the realization of sound sources that appear in static locations independent of head orientation and user position and thus give the impression of an augmented reality sound.

According to the above disclosed embodiments an estimate of the position of the magnetic field sensor (FIG. 2) and the rendering device (FIG. 3), respectively, is used. Generally, it is not relevant how this estimate is determined. Internal or external means may be provided for this purpose. In the embodiments shown in FIGS. 2 and 3 position estimation circuitry 30 is provided as external component that supplies the position estimate. In other embodiments the position estimation circuitry 30 is an internal component of the heading determination device 10 and the rendering device 200, respectively.

The (external or internal) position estimation circuitry 30 may be configured to estimate the position of the magnetic field sensor 20 based on non-magnetic information, e.g. from a communication system, WiFi access points or (e.g. Bluetooth) beacons or ultra-wideband systems. Geomagnetic fingerprinting using the obtained magnetic field sensor data 101 and the magnetic map 103 may also be used by the position estimation circuitry 30 provided as part of the heading determination device 10. Assuming magnetic fingerprinting for localization, at least the magnitude (and optionally the inclination) of the magnetic field should be additionally considered to obtain reliable position estimates. Alternatively or additionally inclination, horizontal and/or vertical magnetic field components (with respect to earth coordinates) can be used to improve the position estimate. Moreover, a complementary technology may be used to obtain a unique location estimate from the geomagnetic field. One possibility is to use (pedestrian) dead reckoning (PDR) based on accelerometer and gyroscope data from on-device sensors, as proposed according to another embodiment.

The location of the orientation determination device can be either obtained by some nonmagnetic localization system (e.g. Wi-Fi access points, Bluetooth beacons, ultra-wideband systems) or by means of magnetic fingerprinting. Assuming magnetic fingerprinting for localization, at least the magnitude of the magnetic field should be additionally considered to obtain reliable position estimates. Alternatively or additionally inclination, horizontal and/or vertical magnetic field components (with respect to earth coordinates) can be used to improve the position estimate. Moreover, a complementary technology may be required to obtain a unique location estimate from the geomagnetic field. One possibility is to use (pedestrian) dead reckoning ((P)DR) based on accelerometer and gyroscope data from on-device sensors, as proposed according to another embodiment.

Figure 4:
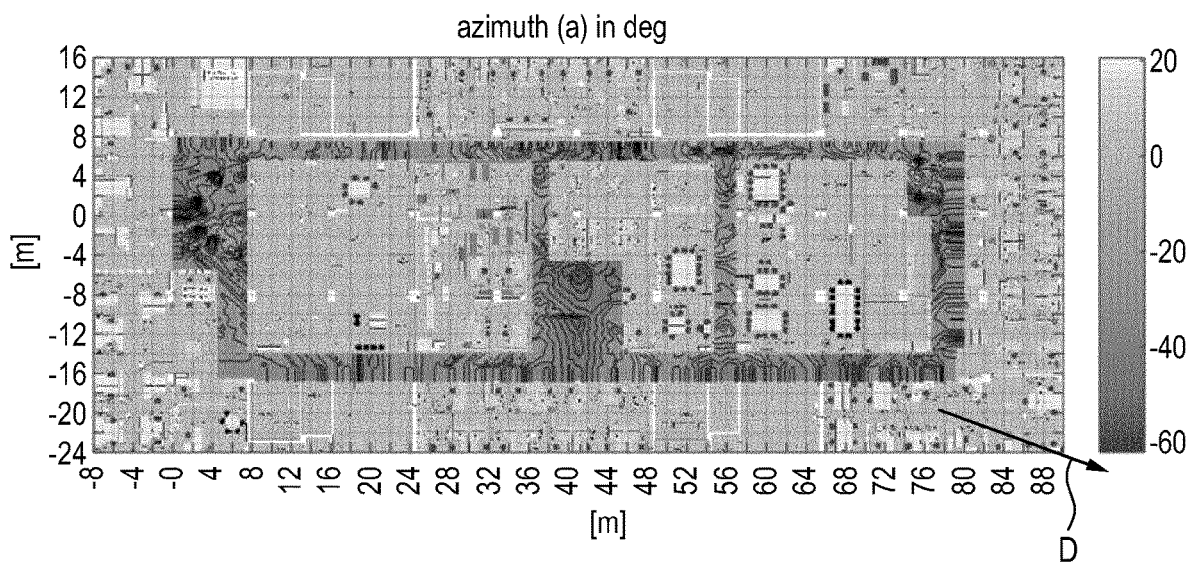
FIG. 4 shows an exemplary magnetic map indicating the location-dependent azimuth distortion.

The magnetic map 103 should contain at least the location-dependent azimuth of the (distorted) magnetic field with respect to a given reference coordinate system (e.g. the earth coordinate system) to obtain a heading estimate in the horizontal plane. FIG. 4 shows an example of a magnetic map in which the magnetic azimuth is recorded in an office building. Here, the coordinate reference system's heading (0 heading) is with respect to the axis of abscissae (x-axis). The example shows the distortions of the azimuth of the magnetic field (magnetic north with respect to the earth coordinates corresponds to −22° as indicated by the arrow D in FIG. 4): The compass heading of the device would deviate from magnetic north at all locations where the azimuth is different from −22°.

Particularly if the x- and y-axes of the magnetic field sensor 20 are known to be lying in a horizontal plane (e.g. if the sensor 20 is attached to a mobile robot), the comparison of the sensed magnetic field's azimuth against the magnetic map azimuth at this location directly provides the absolute heading of the sensor 20 (and of a device incorporating the sensor 20, e.g. a user device such as a smartphone) with respect to the reference coordinate system used to record the magnetic map. The corresponding block diagram of the device is depicted in FIG. 3.

Figure 5:
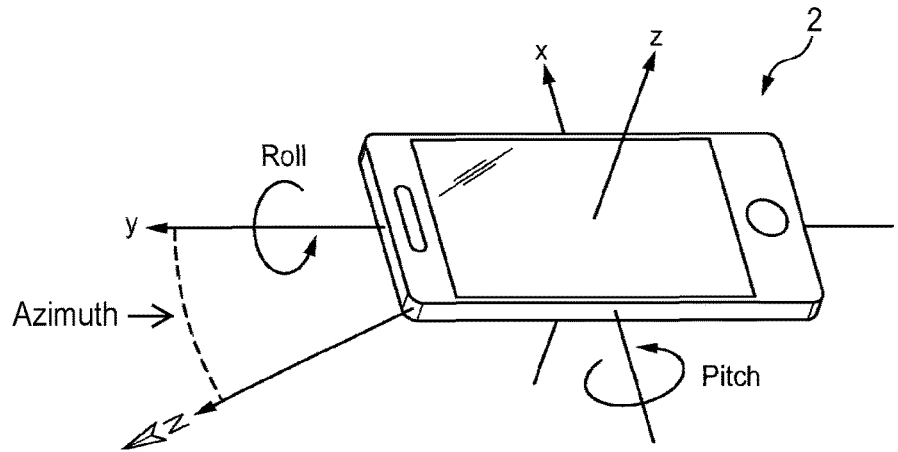
FIG. 5 shows a diagram illustrating device orientation.

In the more general case the device (in particular the magnetic field sensor) can possess an arbitrary orientation in 3D space. FIG. 5 shows a diagram illustrating device orientation by way of a smartphone 2 embedding the disclosed rendering system. This diagram explains the definitions of the orientation by means of three angles (roll, pitch and healing). Other representations of the orientation may be possible as well (e.g. by means of a freely defined rotation axis and angle as used in the following mathematical derivations). The roll/pitch information might be used for 3D rendering information (e.g. to derive 3D positions of virtual sound sources, as will be explained in more detail below). In case only the heading information 107 is used, mainly a 2D rendering is possible.

In order to estimate the 3D orientation of the device, at least one reference vector and one reference angle describing the rotation around this reference vector may be used, against which the measurements can be compared. For simplicity of explanation it is assumed that both local and earth coordinate system share the same sensor origin $x_0=[0\ 0\ 0]^T$ (position aligned) and that all measured vectors obtained from x, y, and z measurements are starting at $x_0$. Comparing against only one reference vector will result in a remaining angular rotation ambiguity around the axis defined by this reference vector. This ambiguity can be resolved with a reference angle information (or some other information that contains the reference angle information).

In the following, the gravity vector shall be used as reference vector information. It is known that this vector points to the center of the earth. The gravity vector can be estimated with an accelerometer. In case of non-static sensors the gyroscope information is used in addition to improve the gravity estimate. As can be seen from FIG. 4, the gravity estimate allows to obtain roll and pitch information. The device heading is still undefined as the heading relates to a rotation around the gravity axis. After alignment of the gravity axis with the sensor's z-axis, the heading information (relative to magnetic north) can be obtained outdoors by calculating the azimuth of the measured magnetic field vector.

In an indoor environment, the earth's magnetic field is distorted and thus its azimuth does not necessarily point to the earth's magnetic north. In an embodiment it is thus proposed to compare the so-obtained azimuth of the measured magnetic field vector against the location-dependent magnetic field data (azimuth) stored in a pre-recorded magnetic map of the building. This comparison allows to not only obtain a more accurate heading estimate. It furthermore can directly deliver the orientation with respect to the x-axis of the reference coordinate system (chosen according to the building's main walls) which is typically more suitable for navigation inside of a building when knowing the heading relative to the earth's magnetic north.

Figure 6:
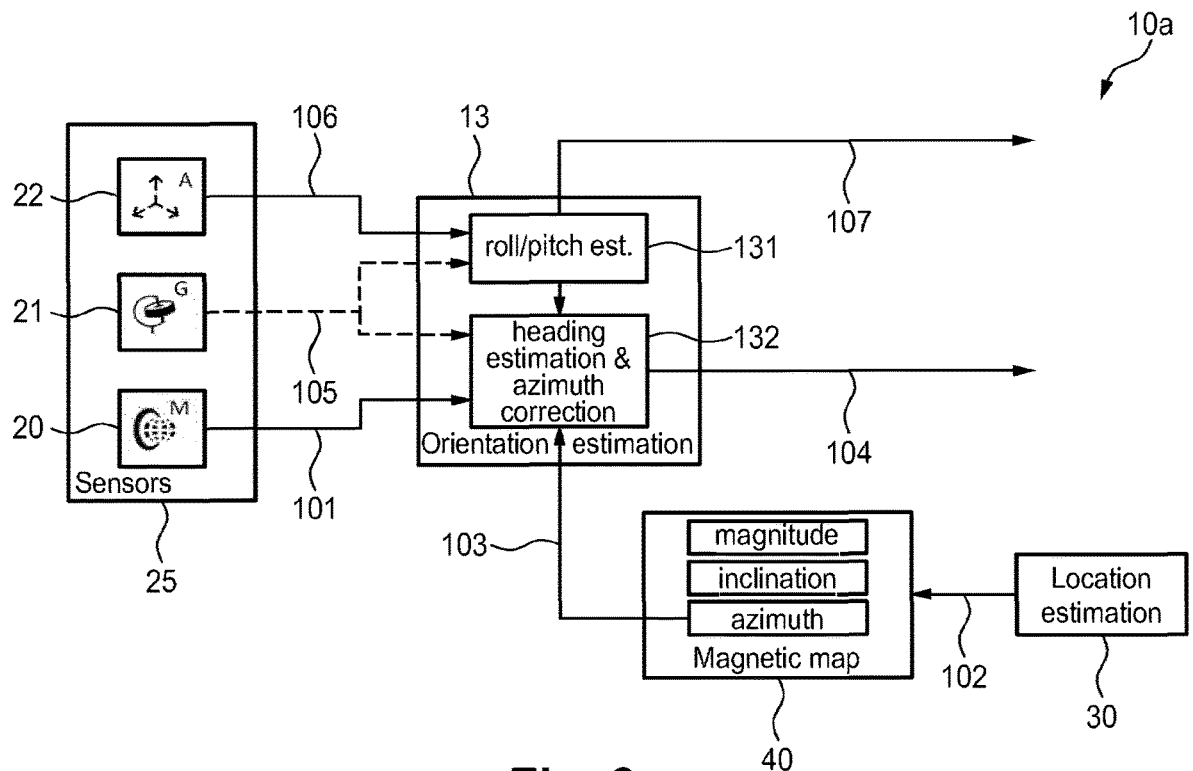
FIG. 6 shows a schematic diagram of a second embodiment of a heading determination device according to the present disclosure.

FIG. 6 shows a schematic diagram of a second embodiment of a heading determination device 10a according to the present disclosure. In this embodiment the interfaces (i.e. input circuitries 11 and 12) have been left out. This embodiment explains details of 3D orientation estimation with roll/pitch (attitude) estimation plus the azimuth-corrected heading estimation, in particular which sensor signals are used to derive the different orientation angles.

The heading determination device 10a comprises a sensor unit 25 comprising the magnetic field sensor 20 providing magnetic field sensor data 101, a gyroscope 21 providing gyroscope data 105 and an accelerometer 22 providing accelerometer data 106. The magnetic field sensor 20, the gyroscope 21 and the accelerometer 22 may also be provided as separate elements instead of being combined into a sensor unit 25.

The position estimation circuitry 30 ("location estimation") provides an estimate 102 of the user's current location. This estimation might use any localization technology as described above.

The estimation circuitry 13 ("orientation estimation") provides an orientation estimate of the device 10a, e.g. a smartphone. Sensor signals are used to derive the different orientation angles. Basically, the accelerometer signal 106 is used to estimate the attitude (roll/pitch) 107, e.g. in an attitude estimation unit 131, by relating the x, y, z-readings of the accelerometer 22 to the gravity direction. The magnetic sensor 20 is used to derive the heading 104, e.g. in a heading estimation unit 132. Optionally, the gyroscope signal 105 might be used to further improve the orientation estimation because it provides very accurate differential information of any orientation changes. Thus, orientation information in 3D can be obtained with this embodiment of the device 10a.

The accuracy of the heading estimate can be further enhanced by a weighted combination of magnetic field data and gyroscope (angular speed). To do so, it is proposed in another embodiment to make use of azimuth and inclination information stored in the magnetic map of the building. The idea hereby is to compute a 3D orientation estimate based on the multiplication of two subsequent rotation alignments to independent reference vectors, namely the 3D gravity vector and the 3D vector of the magnetic field given by the magnetic map value of the building at the location of the sensor. In other words, the rotation matrix R is estimated that fits both the estimated gravity vector and the measured magnetic field vector with direction of gravity and the corresponding magnetic map vector, respectively. The matrix R is unique as long as the magnetic map vector is not lying in the gravity axis (i.e. not parallel to the gravity vector). The sensor orientation can be finally obtained by inverse rotation $\Gamma=R^{-1}$ of the magnetic map coordinate reference system.

There exist different ways to define a rotation in 3D space (e.g. rotation matrices or quaternions). In the following mathematical derivation the rotation is defined in terms of a normalized 3D rotation axis $n=[n_1\ n_2\ n_3]^T$ and a rotation around n by angle $\alpha$. In Cartesian representation the corresponding rotation matrix is defined as $$R(n, \alpha) = \begin{bmatrix} \cos(\alpha) + n_1^2(1-\cos(\alpha)) & n_1n_2(1-\cos(\alpha)) - n_3\sin(\alpha) & n_1n_3(1-\cos(\alpha)) + n_2\sin(\alpha) \\ n_2n_1(1-\cos(\alpha)) + n_3\sin(\alpha) & \cos(\alpha) + n_2^2(1-\cos(\alpha)) & n_2n_3(1-\cos(\alpha)) - n_1\sin(\alpha) \\ n_3n_1(1-\cos(\alpha)) - n_2\sin(\alpha) & n_3n_2(1-\cos(\alpha)) + n_1\sin(\alpha) & \cos(\alpha) + n_3^2(1-\cos(\alpha)) \end{bmatrix}$$

It is assumed that a gravity vector estimate $g_s$ and a magnetic field measurement $m_s$ are available in $\mathbb{R}^3$ in sensor coordinates. Starting with $g_s$, the rotation matrix $R(n_2,\alpha_2)$ that maps $g_s$ to the earth's gravity vector $g_e=[0\ 0\ -g_{earth}]^T$, i.e. $g_e=R(n_2,\alpha_2)g_s$ can be computed where $n_2 = g_s \times g_e / |g_s \times g_e|$ $\alpha_2 = \cos^{-1}(g_s^T g_e / (|g_s||g_e|))$.

This rotation matrix still does not represent a unique solution due to the rotational symmetry of 3D vectors, in this case $g_e$.

Next, $m_s$ is rotated according to $\tilde{m}_s = R(n_2,\alpha_2)m_s$.

In most cases it will be observed that $\tilde{m}_s$ still does not match with the magnetic map vector $m_p$ due to a difference in the azimuth values. The final mapping can be achieved by another rotation around the ambiguity rotation axis given by the normalized vector $n_1 = g_e / |g_e|$.

In order to obtain the rotation angle, the projection $x_0$ of the magnetic map vector $m_p$ on $g_e$ is first computed:

$$x_0 = \frac{g_e^T m_p}{g_e^T g_e} g_e,$$

Then, the rotation angle $\alpha_1$ is derived as the angle between the vectors $v_s = \tilde{m}_s - x_0$ and $v_p = m_p - x_0$:

$\alpha_1 = \hat{\varphi} = \cos^{-1}(V_s^T v_p / (|v_s||v_p|))$.

Finally, multiplication of both estimated rotation matrices yields the final rotation matrix that describes the orientation of the device/sensor with respect to the reference coordinate system:

$\Gamma = R(n_1,\alpha_1)R(n_2,\alpha_2)$.

While the first rotation estimate is rather insensitive to noise, the derivation above provides an interesting insight into the reliability of the second rotation by $\alpha_1 = \hat{\varphi}$, which is in the present case the heading estimate with respect to the x-axis of the reference coordinate system. In fact, this heading estimate may be prone to errors caused by noisy sensor signals and/or an inaccurate position estimate used to look up the magnetic map entry. The shorter the vectors $v_s$ and/or $v_p$ are, the less reliable the heading estimate based on magnetic field information. It is thus proposed in another embodiment to use the vector length $|v_s|$ or $\equiv v_p|$ or any mathematical function thereof as weight information for the magnetic field heading estimate in a joint heading estimation process based on gyroscope and magnetic field information. Exemplary weights w are:

$(|v_s|) = |v_s| / |\overline{m}_s|$
$w(|v_p|) = |v_p| / |\overline{m}_p|$
$w(|v_s|) = |v_s|^2 / \sigma_s^2$ with sensor noise variance $\sigma_s^2$
$w(|v_s|, |v_p|) = \min(|v_s|, |v_p|)$.

Many orientation algorithms using accelerometer, gyroscope and magnetic sensors are based on an adaptive design (i.e. new orientation estimates are obtain based on the previous orientation estimate and the new incoming sensor data). Typically, a weighting factor β controls the weight between the relative update based on the gyroscope and the absolute update based on the accelerometer and magnetometer. It is proposed in another embodiment to make this weighting factor β dependent on the above factor w.

Based on the location and orientation information of the device (i.e. sensor) and the known target location, relative distance between device and target as well as direction from the device to the target can be calculated and applied to a large number of applications.

In the following, details of a rendering system according to the present disclosure shall be described. Generally, the rendering system comprises a magnetic field sensor 20 configured to sense magnetic field sensor data 101, a heading determination device 10, 10a as disclosed herein and as e.g. shown in FIG. 2 or 6, and a rendering device 200 as disclosed herein and as e.g. shown in FIG. 3 configured to determine the relative position of one or more targets with respect to the rendering device based on determined heading or orientation information 104 and to render target information 215 related to one or more targets using the determined relative position 214 of the one or more targets. These elements may be combined in a wearable or handheld device that can be carried around by a user such as a smartphone, table, smart watch, camera, other wrist-worn device, etc.

Figure 7:
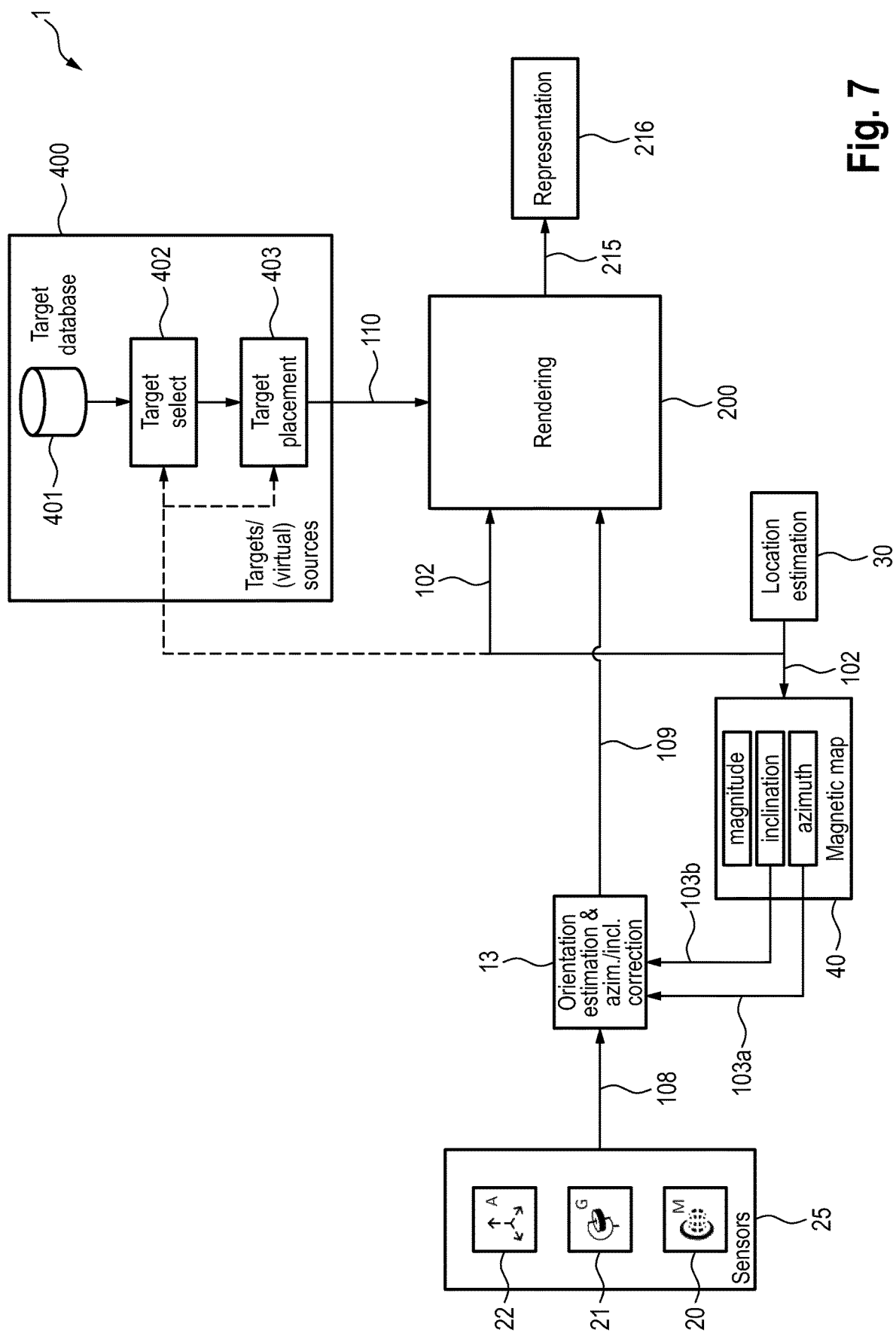
FIG. 7 shows a schematic diagram of an embodiment of a rendering system according to the present disclosure.

FIG. 7 shows a schematic diagram of a detailed embodiment of a rendering system 1 according to the present disclosure. For simplicity interfaces in the different devices have been left out in FIG. 7.

The location estimation unit 30 provides an estimate 102 of the user's current location. This estimation might use any localization technology as described above. The estimation unit 13 provides a heading or orientation estimate 109 of the device. This heading/orientation estimation 109 may be based on the measurements of the inertial sensors 21 of the sensor unit 25. In the 2D case, the estimation unit 13 calculates a heading estimate.

In the more general 3D case, the estimation unit 13 may additionally provide information about the attitude (roll and pitch) to obtain an orientation estimate. The orientation information might be used for 3D rendering information, e.g. to derive 3D positions of the virtual sound sources, as will be described below.

In case only the heading is used, only a 2D rendering is possible. This heading estimate might be disturbed as described above. The estimation unit 13 corrects the heading based on the magnetic map information (in particular azimuth information 103a and/or inclination information 103b) and the current position estimate 102. After the correction, the heading information 109 representing the device heading in the reference coordinate system (e.g. the earth coordinate system) is given.

Figure 8:
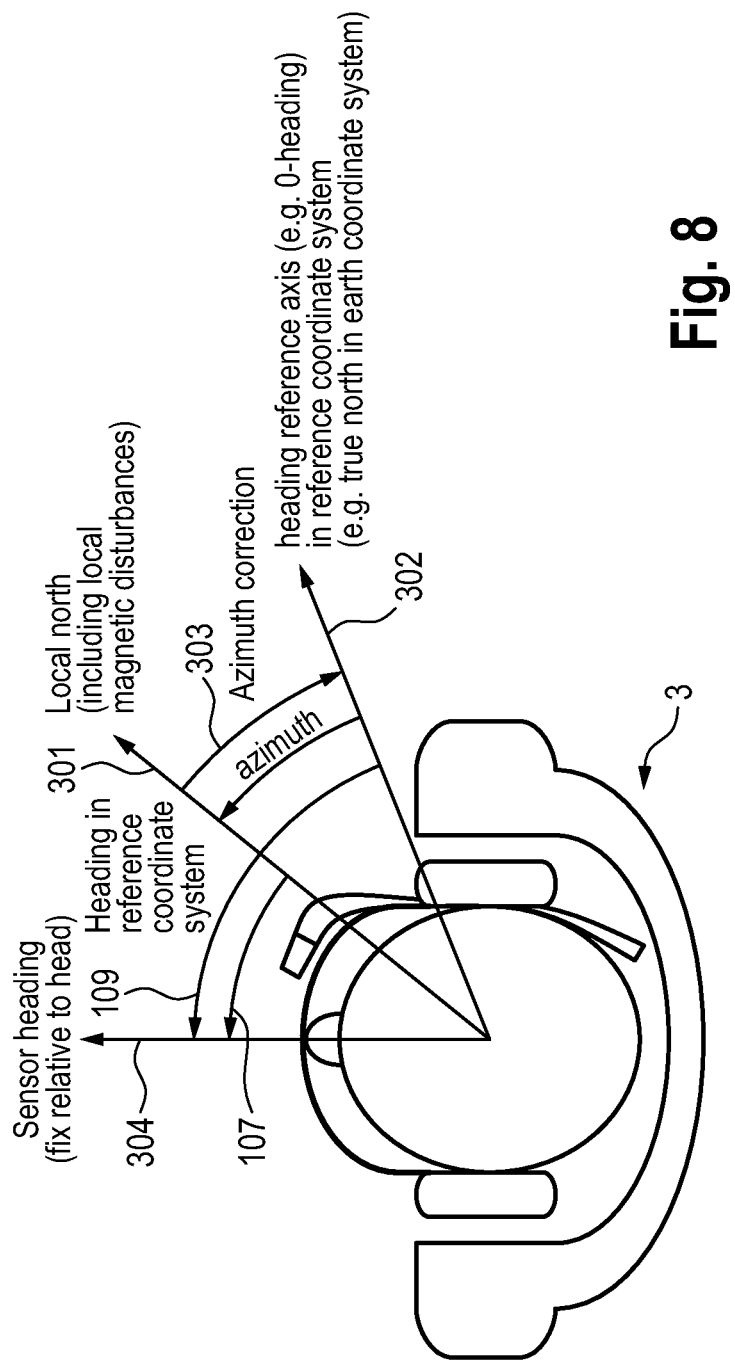
FIG. 8 shows a diagram illustrating azimuth correction.

FIG. 8 illustrates these heading relations. In this example, the rendering system is embedded in a headphone 3 and the sensor heading corresponds to the heading of the user's head. The estimation circuitry 13 provides a heading estimate in a sensor coordinate system with respect to the local north 301 of the sensor, which does not correspond to the true north 302 in a reference coordinate system (e.g. the earth coordinate system), but is disturbed e.g. by local magnetic disturbances. To compensate this deviation, an azimuth correction value 303 is taken from the magnetic map at the current location, and the heading estimate is corrected by this azimuth correction value 303 resulting in the corrected heading information 109 representing the heading in the reference coordinate system. For this correction it is assumed that the sensor heading 304 with respect to the head is fixed.

Referring to FIG. 7 again, the rendering device 200 uses the position information 102 and the heading information 109 (and optionally the attitude information) to combine them with the position of one or more targets 110 obtained from a target control device 400 (e.g. an external or internal processor). This target information related to the one or more targets may then be rendered in another "representation" 216, e.g. as virtual sound sources. Details of the rendering process will be discussed below for different applications or embodiments of the system.

The target control device 400 may comprise a target database 401, a target selector 402 that selects one or more targets from the target database 401 based on the position information 102 and a target placement unit 403 for providing information on the desired targets, in particular the location (and optionally orientation) of the one or more targets The device, system and method according to the present disclosure is especially suited for mobile and wearable devices due to today's availability of the required sensors (accelerometer, gyroscope, and magnetometer) in such devices and its low power consumption compared to other technologies such as Visual SLAM or wideband MIMO systems. The target(s) can be either indoor or outdoor, whereas the device is located indoor. Example applications are enhanced compass, which shows the relative distance and direction to target(s), and sound augmented reality (AR), according to which a virtual sound source is created at a specific location (or trajectory for moving targets) independent of the mobile device (user) location and heading.

Figure 9:
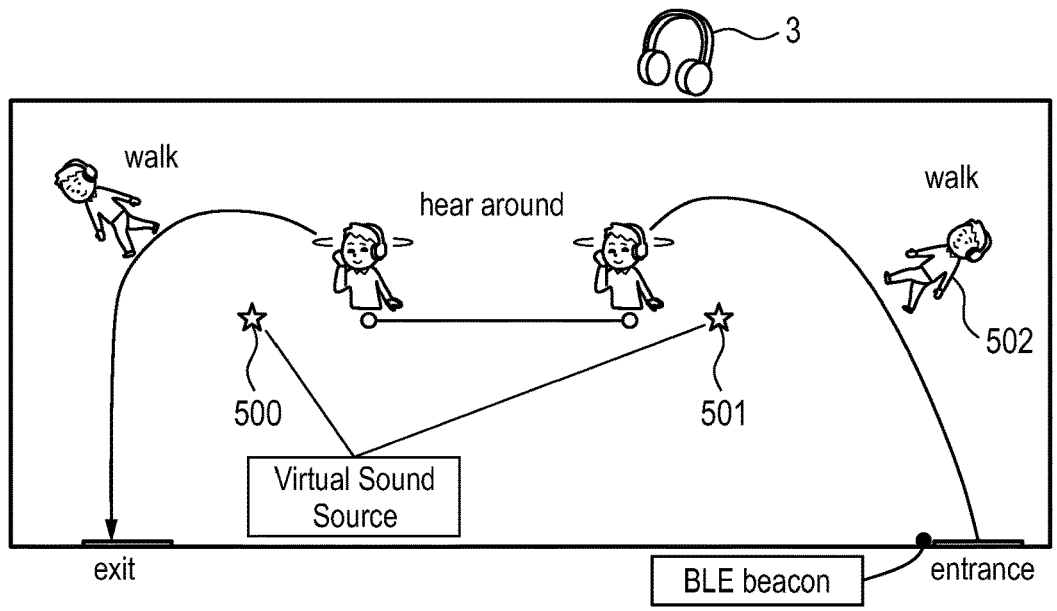
FIG. 9 shows a diagram illustrating a first application scenario of the disclosed devices and methods.
Figure 10:
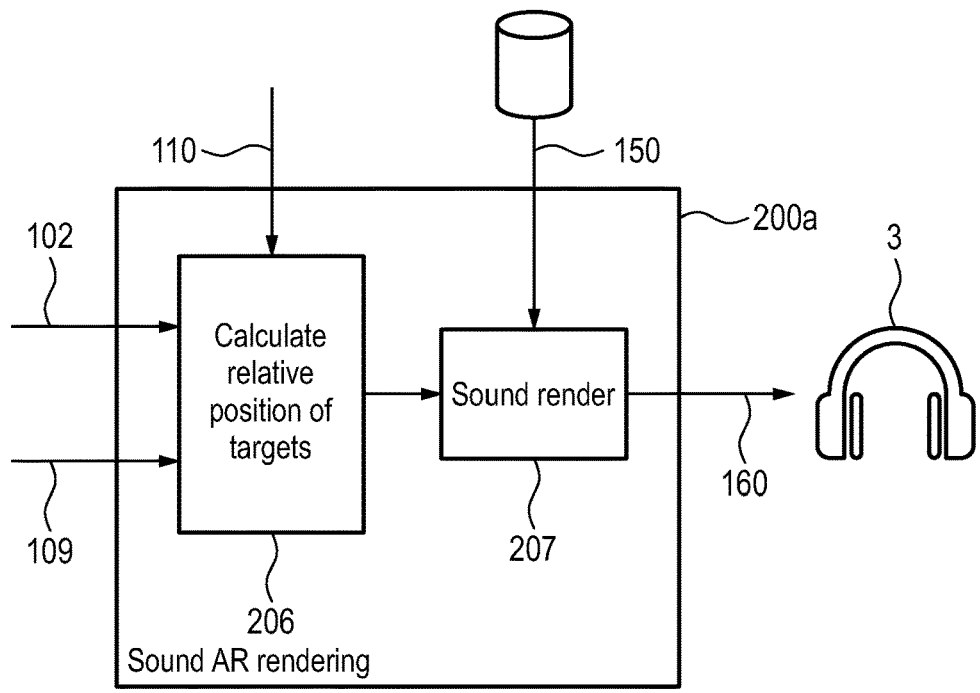
FIG. 10 shows a schematic diagram of a second embodiment of a rendering device according to the present disclosure for use in the application scenario shown in FIG. 9.

The rendering process described above, e.g. with reference to FIG. 7, will now be explained in more detail for two different embodiments illustrated in FIGS. 9 and 10. FIG. 9 shows a diagram illustrating a sound AR application; FIG. 10 shows a diagram illustrating a corresponding embodiment of a rendering device 200a (the interfaces are not shown) for use in this application scenario, which may be embedded in a headphone 3. The position of the target(s), represented by the target information 110, corresponds to the virtual sound sources 500, 501 in this embodiment. In a first step, the relative position of the sound sources 500, 501 is calculated in a computation unit 206 based on the position estimate 102 and the heading information 109 of the user 502 and the position of the sound sources 500, 501. Next, the audio signals 150 of the sound sources 500, 501 and the position 110 of the sound sources 500, 501 relative to the user's position and orientation are used in a sound renderer 207 (e.g. Dolby surround or any other surround sound system) to generate the sound signals 160 to be played back by the headphones 3. A beacon, e.g. a BLE (Bluetooth low energy) beacon at the entrance (and optionally exit) may be used to notice that a user enters the area in which this application scenario shall be used.

Figure 11:
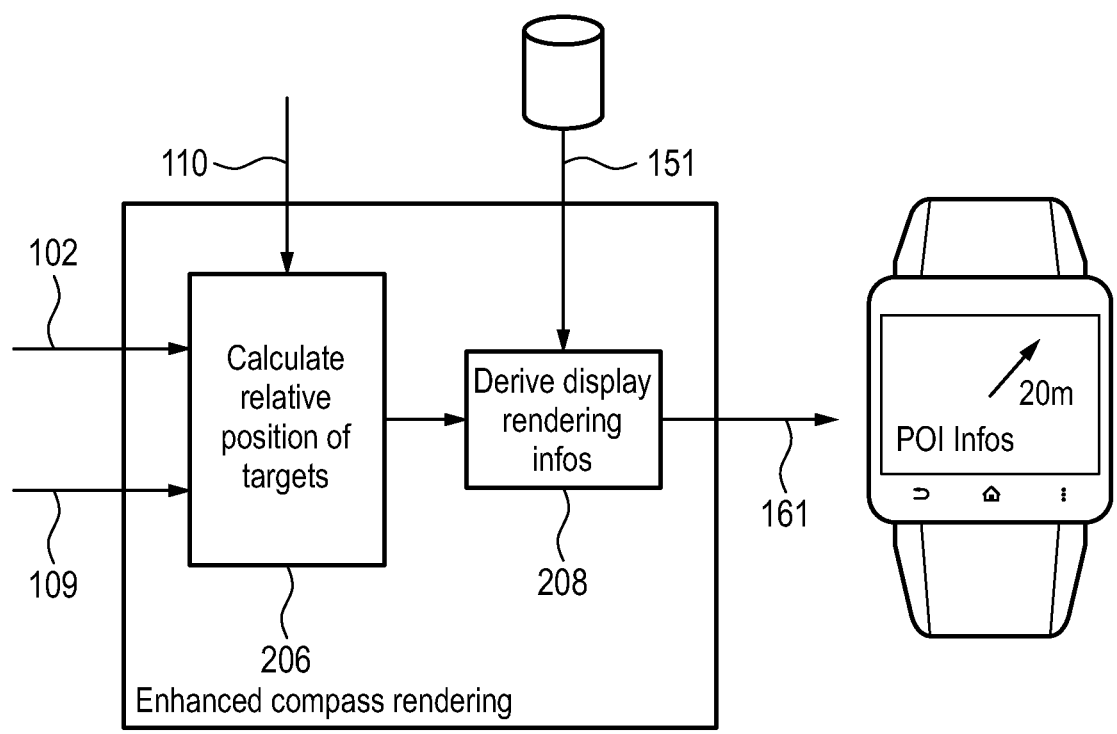
FIG. 11 shows a schematic diagram of a third embodiment of a rendering device according to the present disclosure for use in a second application scenario.

FIG. 11 shows a schematic diagram of a third embodiment of a rendering device 200b according to the present disclosure for use in a second application scenario, in particular for an enhanced compass application. Here, the position of the targets may correspond to any point(s) of interest (e.g. a certain store, product, Pokémon, treasure (gaming), person, etc.). Again, the relative position of the target(s) is calculated based on the position estimate 102 and the heading information 109 of the user and the position of the targets represented by the target information 110. Based on this result, some display information 161 by the display renderer 208 is derived, e.g. the heading towards the target relative to the device orientation (e.g. smartwatch or smartphone) and the distance. This information may be combined with some additional information 151 about the target to be illustrated on the display of e.g. the mobile device.

In another embodiment both applications may be combined to realize navigation by "follow sound source". Here, virtual sound sources guide the user in the direction of the point of interest, e.g. where the sound source appears at the location of the target itself (or direction of the target e.g. 5 m away from the user).

The targets may be selected based on the current position estimate, e.g. by approaching a certain exhibition object in a museum some audio information is played back coming from the exhibition object. Also, the targets may move, e.g. some narrator is explaining something while walking (the voice appears to your right hand side as if a person is walking beside you, etc.). In case of the navigation by "follow sound source" the sound source may change depending on the user's current position, e.g. the sound appears in front of user in order to guide the user in the right direction. The sound source is updated to follow the navigation path: typically, the direct way to the target is not possible and the user has to follow some hallways or move around corners, etc.

Essential advantages can be achieved by the present disclosure:
 absolute heading (with respect to defined reference coordinate system) can be directly obtained from comparison of magnetic field measurement with the location-specific magnetic map entry (azimuth correction);
 magnetic map can be independently used to get position information based on magnetic fingerprinting;
 low power solution to obtain relative distance and direction information between mobile/wearable device located indoor and target(s) located either indoor or outdoor,
 required sensors (accelerometer, gyroscope, magnetometer) are widely available in today's mobile and wearable devices;
 no dedicated infrastructure required in the building (magnetic map of building is sufficient).

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A heading determination device comprising:
   data input circuitry configured to obtain magnetic field sensor data sensed by a magnetic field sensor in sensor coordinates,
   position input circuitry configured to obtain a position estimate of the magnetic field sensor, and
   estimation circuitry configured to derive, from a magnetic map, a local azimuth distortion value in a reference coordinate system at the current position of the magnetic field sensor indicated by the obtained position estimate and to estimate the heading of the magnetic field sensor in the reference coordinate system based on the obtained magnetic field sensor data and the derived local azimuth distortion value.

2. The heading determination device as defined in embodiment 1,
   wherein said estimation circuitry is configured to estimate the heading of the magnetic field sensor by subtracting the azimuth distortion value from or adding the azimuth distortion value to an azimuth value contained in or derived from the obtained magnetic field sensor data.

3. The heading determination device as defined in embodiment 1 or 2,
   wherein said data input circuitry is configured to obtain accelerometer data sensed by an accelerometer, said accelerometer data indicating acceleration of the magnetic field sensor, and
   wherein said estimation circuitry is configured to estimate attitude information of the magnetic field sensor based on the obtained accelerometer data.

4. The heading determination device as defined in embodiment 3,
   wherein said estimation circuitry is configured to estimate roll and/or pitch of the magnetic field sensor as attitude information.

5. The heading determination device as claimed in embodiment 3 or 4,
   wherein said estimation circuitry is configured to estimate the orientation of the magnetic field sensor in the reference coordinate system based on the estimated heading and the estimated attitude information of the magnetic field sensor.

6. The heading determination device as defined in any one of embodiments 3 to 5,
   wherein said estimation circuitry is configured to determine a gravity estimate from the obtained accelerometer data and to align a z-axis of the magnetic field sensor to the earth's gravity axis based on said gravity estimate before estimating the heading of the magnetic field sensor.

7. The heading determination device as defined in any one of embodiments 3 to 6,
   wherein said data input circuitry is configured to obtain gyroscope data sensed by a gyroscope, said gyroscope data indicating orientation of the magnetic field sensor, and wherein said estimation circuitry is configured to estimate the attitude information of the magnetic field sensor based on the obtained accelerometer data and the obtained gyroscope data.

8. The heading determination device as defined in any preceding embodiment,
   wherein said estimation circuitry is configured to estimate the orientation of the magnetic field sensor in the reference coordinate system by a multiplication of two subsequent rotation alignments to a gravity vector and a magnetic map vector of the magnetic field obtained from the magnetic map at the position of the magnetic field sensor.

9. The heading determination device as defined in embodiment 8,
   wherein said estimation circuitry is configured to estimate a rotation matrix that fits the gravity vector with direction of gravity and that fits the measured magnetic field vector with the corresponding magnetic map vector and to estimate the orientation of the magnetic field sensor by inversion rotation of the reference coordinate system using the inverse of the estimated rotation matrix.

10. The heading determination device as defined in any preceding embodiment,
    further comprising position estimation circuitry configured to estimate the position of the magnetic field sensor.

11. The heading determination device as claimed in claim 10,
    wherein said position estimation circuitry is configured to estimate the position of the magnetic field sensor based on information from a communication system, WiFi access points or beacons and/or based on geomagnetic fingerprinting using the obtained magnetic field sensor data and the magnetic map.

12. The heading determination device as claimed in claim 10 or 11,
    wherein said position estimation circuitry is configured to estimate the position of the magnetic field sensor based on magnitude and/or inclination included in or derived from the obtained magnetic field sensor data and/or based on an inclination estimate indicating the inclination of the magnetic field sensor.

13. A rendering device comprising:
    orientation input circuitry configured to obtain orientation information indicating the orientation of the rendering device,
    position input circuitry configured to obtain a position estimate of the rendering device,
    target position input circuitry configured to obtain target position information indicating a target position of one or more targets and optionally target orientation information indicating a target orientation of one or more targets, relative target position determination circuitry configured to determine the relative position of the one or more targets with respect to the rendering device based on the obtained orientation information, the obtained position estimate and the obtained target position information and optionally target orientation information, and rendering circuitry configured to render target information related to the one or more targets using the determined relative position of the one or more targets.

14. The rendering device as defined in embodiment 13, wherein the target positions of one or more targets are positions of virtual sound sources and wherein said rendering circuitry is configured to render audio signals in a way as if they were rendered at the position of said virtual sound sources.

15. The rendering device as defined in embodiment 13 or 14,
wherein said rendering circuitry is configured to render display information indicating distance and/or direction to one or more of said targets.

16. The rendering device as defined in any one of embodiments 13 to 15,
further comprising target selection circuitry configured to select one or more targets based on the position estimate of the rendering device.

17. The rendering device as defined in any one of embodiments 13 to 16,
wherein said target position input circuitry is configured to continuously, regularly or occasionally obtain a new target position.

18. A rendering system comprising:
a magnetic field sensor configured to sense magnetic field sensor data,
a heading determination device as defined in any one of embodiments 1 to 12 and
a rendering device as defined in any one of embodiments 13 to 17 configured to determine the relative position of one or more targets with respect to the rendering device based on determined heading or orientation information and to render target information related to one or more targets using the determined relative position of the one or more targets.

19. The rendering system as defined in embodiment 18, further comprising an accelerometer configured to acquire accelerometer data and/or a gyroscope configured to acquire gyroscope data.

20. A position determination method comprising:
obtaining magnetic field sensor data sensed by a magnetic field sensor in sensor coordinates,
obtaining a position estimate of the magnetic field sensor,
deriving, from a magnetic map, a local azimuth distortion value in a reference coordinate system at the current position of the magnetic field sensor indicated by the obtained position estimate and
estimating the heading of the magnetic field sensor in the reference coordinate system based on the obtained magnetic field sensor data and the derived local azimuth distortion value.

21. A rendering method comprising:
obtaining orientation information indicating the orientation of the rendering device,
obtaining a position estimate of the rendering device,
obtaining target position information indicating a target position of one or more targets,
determining the relative position of the one or more targets with respect to the rendering device based on the obtained orientation information, the obtained position estimate and the obtained target position information, and
rendering target information related to the one or more targets using the determined relative position of the one or more targets.

22. A non-transitory computer-readable recording medium that stores therein a computer program product, which, when executed by a processor, causes the method according to embodiment 20 or 21 to be performed.

23. A computer program comprising program code means for causing a computer to perform the steps of said method according to embodiment 20 or 21 when said computer pro-gram is carried out on a computer.

The invention claimed is:

1. A heading determination device, comprising:
data input circuitry configured to obtain magnetic field sensor data sensed by a magnetic field sensor in sensor coordinates,
position input circuitry configured to obtain a position estimate of the magnetic field sensor, and
estimation circuitry configured to derive, from a magnetic map, a local azimuth distortion value in a reference coordinate system at the current position of the magnetic field sensor indicated by the obtained position estimate and to estimate the heading of the magnetic field sensor in the reference coordinate system based on the obtained magnetic field sensor data and the derived local azimuth distortion value, wherein the heading estimate is enhanced by a weighted combination of magnetic field data and angular speed,
wherein said estimation circuitry is configured to estimate an orientation of the magnetic field sensor in the reference coordinate system by a multiplication of two subsequent rotation alignments to a gravity vector and a magnetic map vector of the magnetic field obtained from the magnetic map at the position of the magnetic field sensor,
wherein said estimation circuitry is configured to estimate a rotation matrix that fits the gravity vector with direction of gravity and that fits the measured magnetic field vector with the corresponding magnetic map vector and to estimate the orientation of the magnetic field sensor by inversion rotation of the reference coordinate system using the inverse of the estimated rotation matrix,
wherein the heading determination device is included in a wearable or handheld electronic device and the estimated heading of the magnetic field sensor is used by the wearable or handheld electronic device to determine a position of a target point of interest relative to the wearable or handheld electronic device.

2. The heading determination device as claimed in claim 1,
wherein said estimation circuitry is configured to estimate the heading of the magnetic field sensor by subtracting the azimuth distortion value from or adding the azimuth distortion value to an azimuth value contained in or derived from the obtained magnetic field sensor data.

3. The heading determination device as claimed in claim 1,
wherein said data input circuitry is configured to obtain accelerometer data sensed by an accelerometer, said accelerometer data indicating acceleration of the magnetic field sensor, and wherein said estimation circuitry is configured to estimate attitude information of the magnetic field sensor based on the obtained accelerometer data.

4. The heading determination device as claimed in claim 3,
wherein said estimation circuitry is configured to estimate roll and/or pitch of the magnetic field sensor as attitude information, and/or the orientation of the magnetic field sensor in the reference coordinate system based on the estimated heading and the estimated attitude information of the magnetic field sensor.

5. The heading determination device as claimed in claim 3,
wherein said estimation circuitry is configured to determine a gravity estimate from the obtained accelerometer data and to align a z-axis of the magnetic field sensor to the earth's gravity axis based on said gravity estimate before estimating the heading of the magnetic field sensor.

6. The heading determination device as claimed in claim 3,
wherein said data input circuitry is configured to obtain gyroscope data sensed by a gyroscope, said gyroscope data indicating orientation of the magnetic field sensor, and
wherein said estimation circuitry is configured to estimate the attitude information of the magnetic field sensor based on the obtained accelerometer data and the obtained gyroscope data.

7. The heading determination device as claimed in claim 1,
further comprising position estimation circuitry configured to estimate the position of the magnetic field sensor.

8. The heading determination device as claimed in claim 7,
wherein said position estimation circuitry is configured to estimate the position of the magnetic field sensor based on one or more of
information from a communication system, WiFi access points or beacons,
geomagnetic fingerprinting using the obtained magnetic field sensor data and the magnetic map,
magnitude and/or inclination included in or derived from the obtained magnetic field sensor data, and
an inclination estimate indicating the inclination of the magnetic field sensor.

9. A rendering device, comprising:
orientation input circuitry configured to obtain orientation information indicating the orientation of the rendering device, wherein the orientation information includes
an estimate of a heading of magnetic field sensor data and a derived local azimuth distortion value, wherein the heading estimate is enhanced by a weighted combination of magnetic field data and angular speed, and
an estimate of a rotation matrix that fits a gravity vector with direction of gravity and that fits a measured magnetic field vector with a corresponding magnetic map vector, and an estimate of the orientation of the magnetic field sensor by inversion rotation of the reference coordinate system using the inverse of the estimated rotation matrix,
position input circuitry configured to obtain a position estimate of the rendering device,
target position input circuitry configured to obtain target position information indicating a target position of one or more targets,
relative target position determination circuitry configured to determine the relative position of the one or more targets with respect to the rendering device based on the obtained orientation information, the obtained position estimate and the obtained target position information, and
rendering circuitry configured to render target information related to the one or more targets using the determined relative position of the one or more targets,
wherein the rendering device is included in a wearable or handheld electronic device and the estimated heading of the magnetic field sensor is used by the wearable or handheld electronic device to determine the target position of the one or more targets relative to the wearable or handheld electronic device.

10. The rendering device as claimed in claim 9,
wherein the target positions of one or more targets are positions of virtual sound sources and wherein said rendering circuitry is configured to render audio signals in a way as if they were rendered at the position of said virtual sound sources.

11. The rendering device as claimed in claim 9,
wherein said rendering circuitry is configured to render display information indicating distance and/or direction to one or more of said targets.

12. The rendering device as claimed in claim 9,
further comprising target selection circuitry configured to select one or more targets based on the position estimate of the rendering device.

13. The rendering device as claimed in claim 9,
wherein said target position input circuitry is configured to continuously, regularly or occasionally obtain a new target position.

14. A position determination method, comprising:
obtaining magnetic field sensor data sensed by a magnetic field sensor in sensor coordinates;
obtaining a position estimate of the magnetic field sensor;
deriving, from a magnetic map, a local azimuth distortion value in a reference coordinate system at the current position of the magnetic field sensor indicated by the obtained position estimate;
estimating the heading of the magnetic field sensor in the reference coordinate system based on the obtained magnetic field sensor data and the derived local azimuth distortion value, wherein the heading estimate is enhanced by a weighted combination of magnetic field data and angular speed,
estimating an orientation of the magnetic field sensor in the reference coordinate system by a multiplication of two subsequent rotation alignments to a gravity vector and a magnetic map vector of the magnetic field obtained from the magnetic map at the position of the magnetic field sensor;
estimating a rotation matrix that fits the gravity vector with direction of gravity and that fits the measured magnetic field vector with the corresponding magnetic map vector and to estimate the orientation of the magnetic field sensor by inversion rotation of the reference coordinate system using the inverse of the estimated rotation matrix; and
determining, by a wearable or handheld electronic device, a position of a target point of interest relative to the wearable or handheld electronic device based on the estimated heading of the magnetic field sensor.

15. A non-transitory computer-readable recording medium that stores therein a computer program product, which, when executed by a processor, causes the method according to claim 14 to be performed.

16. A rendering method, comprising:
- obtaining orientation information indicating the orientation of the rendering device, wherein the orientation information includes
  - an estimate of a heading of magnetic field sensor data and a derived local azimuth distortion value, wherein the heading estimate is enhanced by a weighted combination of magnetic field data and angular speed, and
  - an estimate of a rotation matrix that fits a gravity vector with direction of gravity and that fits a measured magnetic field vector with a corresponding magnetic map vector, and an estimate of the orientation of the magnetic field sensor by inversion rotation of the reference coordinate system using the inverse of the estimated rotation matrix;
- obtaining a position estimate of the rendering device;
- obtaining target position information indicating a target position of one or more targets;
- determining, by a wearable or handheld electronic device that includes the rendering device, the target position of the one or more targets relative to the wearable or handheld electronic device based on the obtained orientation information, the obtained position estimate and the obtained target position information; and
- rendering, via the wearable or handheld electronic device, target information related to the one or more targets using the determined relative position of the one or more targets.

* * * * *